(12) United States Patent
Shen et al.

(10) Patent No.: US 8,531,229 B2
(45) Date of Patent: Sep. 10, 2013

(54) LEVEL SHIFTING CIRCUIT

(75) Inventors: Shin-Jang Shen, Jhubei (TW); Lo Chi, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 13/362,976

(22) Filed: Jan. 31, 2012

(65) Prior Publication Data

US 2013/0194020 A1  Aug. 1, 2013

(51) Int. Cl.
*H03L 5/00* (2006.01)

(52) U.S. Cl.
USPC .................................. 327/333; 326/80; 326/81

(58) Field of Classification Search
USPC ........... 327/333, 309, 313, 427, 540; 326/68, 326/80, 81; 365/189.11
See application file for complete search history.

(56) References Cited

U.S. PATENT DOCUMENTS

| 8,106,701 B1* | 1/2012 | Huynh et al. ................. 327/333 |
| 2011/0273940 A1* | 11/2011 | Tanzawa .................. 365/189.11 |
| 2012/0230111 A1* | 9/2012 | Tanzawa .................. 365/185.18 |

\* cited by examiner

*Primary Examiner* — Long Nguyen
(74) *Attorney, Agent, or Firm* — Haynes Beffel & Wolfeld LLP (57) ABSTRACT

An integrated circuit has a level shifter, a pull-circuit, and a voltage regulator. The level shifter and the pull-up circuit receive power from the same supply voltage. The voltage regulator changes the voltage level from the supply voltage to another voltage level used by the level shifter.

26 Claims, 10 Drawing Sheets

Fig. 7 "LEVEL SHIFTER" EXAMPLE #1

Fig. 8 "LEVEL SHIFTER" EXAMPLE #2

LEVEL SHIFTING CIRCUIT

BACKGROUND

1. Field of the Invention

This technology relates to a level shifting circuit that changes the maximum and/or minimum voltages between the input and output, such as for a power switch or word line driver.

2. Description of Related Art

A level shifting circuit has multiple stages, with each stage having an output voltage with maximum and/or minimum voltages changed from the input voltage. The maximum output voltage of a particular stage is determined by the supply voltage providing power to that particular stage. Accordingly, different stages of a level shifting circuit receive power from different supply voltages.

However, the use of multiple supply voltages is associated with current leakage. Current leakage occurs from a supply voltage providing a higher voltage to a supply voltage providing a lower voltage.

The multiple supply voltages can be provided by multiple voltage pumps powered by the external voltage, using capacitors to create lower or higher voltage power sources. Multiple voltage pumps have different setup and recovery times, with leakage between the voltage pumps, such as when switching the supply voltage on or off. A voltage pump consumes power to change the voltage of charge, and to lose the voltage pumped charge to leakage represents a waste of power. Current leakage between the multiple supply voltages not only wastes power, it requires more demanding charge pump design to compensate for the current leakage.

One approach to preventing or decreasing the current leakage between different supply voltages, is timing control and level control of the different supply voltages and the signals received by the level shifting circuit. Such timing control and level control minimizes leakage paths through the level shifting circuit, at the cost of the extra circuitry performing the timing control and level control and associated extra power requirements.

SUMMARY

Technology is described here that is an integrated circuit including a level shifter powered by a first supply voltage, a pull-up circuit powered by a first supply voltage, and a voltage regulator circuit.

The voltage regulator circuit receives the second supply voltage and provides the first supply voltage to the level shifter. The first supply voltage is based on the reference voltage.

In some embodiments of the voltage regulator circuit, the voltage regulator circuit includes a transistor having a threshold voltage with a magnitude determining the first supply voltage. In some embodiments of the described technology, the transistor of the voltage regulator circuit is a depletion mode transistor. The depletion mode transistor receives the second supply voltage and provides the first supply voltage to the level shifter.

In some embodiments of the voltage regulator circuit, the depletion mode transistor has a drain coupled to the second supply voltage, a source providing the first supply voltage, and a gate coupled to a reference voltage. In some embodiments of the described technology, the first supply voltage is determined by a sum of the reference voltage and a magnitude of the negative threshold voltage of the depletion mode transistor.

In some embodiments of the voltage regulator circuit, the reference voltage coupled to the gate of the depletion mode transistor is a ground voltage. In some embodiments of the described technology, the depletion mode transistor has a negative threshold voltage with a magnitude determining the first supply voltage.

The level shifter has an output providing a level shifter voltage output, with a first maximum voltage determined by a first supply voltage provided to the level shifter.

In some embodiments of the level shifter, the level shifter is a negative level shifter that widens a signal received by the level shifter, by including in the level shifter voltage output, a negative voltage magnitude absent from the signal received by the level shifter.

In some embodiments of the level shifter, the level shifter includes a first p-type transistor and a first n-type transistor in a first series connection between the first supply voltage and a reference voltage, and a second p-type transistor and a second n-type transistor in a second series connection between the first supply voltage and the reference voltage.

The pull-up circuit is coupled to the output of the level shifter. The pull-up circuit has an output providing a pull-up circuit voltage output. The pull-up circuit voltage output has a second maximum voltage. The second maximum voltage is determined by a second supply voltage provided to the pull-up circuit. The second maximum voltage of the pull-up circuit is higher than the first maximum voltage of the pull-up circuit.

In some embodiments of the pull-up circuit, the pull-up circuit widens a signal received by the pull-up circuit, by including, in the pull-up circuit voltage output, a positive voltage magnitude absent from the signal received by the pull-up circuit.

In some embodiments of the pull-up circuit, the pull-up circuit includes an n-type depletion mode transistor and a p-type transistor in a series connection between the first supply voltage and the output of the pull-up circuit. The n-type depletion mode transistor has a gate coupled to the output of the pull-up circuit. The p-type transistor has a gate coupled to the level shifter.

Some embodiments further include a voltage pump that provides power to the first supply voltage and the second supply voltage simultaneously. The voltage pump provides power to the level shifter and the pull-up circuit.

Another technology described here is a method of voltage level shifting. In the method, power is provided from a voltage pump generating a first supply voltage to (i) a level shifter having an output and (ii) a pull-up circuit coupled to the output of the level shifter. This step further includes several steps. Power is provided to the pull-up circuit from the first supply voltage. The first supply voltage is regulated to provide a second supply voltage, such that the second supply voltage lower than the first supply voltage. Power is provided to the level shifter from the second supply voltage.

In some embodiments, the level shifter provides a level shifter voltage output having a first maximum voltage determined by the second supply voltage. The pull-up circuit provides a pull-up circuit voltage output with a second maximum voltage determined by the first supply voltage. The second maximum voltage higher than the first maximum voltage.

In some embodiments of the voltage regulation, the first supply voltage is received at a transistor having a threshold voltage. The transistor provides the second supply voltage, which is determined by a magnitude of the threshold voltage of the transistor. In some embodiments of the voltage regulation, the transistor is a depletion mode transistor having a negative threshold voltage, and the second supply voltage is determined by a magnitude of the negative threshold voltage of the depletion mode transistor.

In some embodiments of the described technology, the first supply voltage is received at a drain of the depletion mode transistor, and a source of the depletion mode transistor provides the second supply voltage to the level shifter. In some embodiments of the described technology, the depletion mode transistor has a negative threshold voltage, and the second supply voltage is determined by a sum of a magnitude of the negative threshold voltage and a reference voltage at a gate of the depletion mode transistor. In some embodiments of the described technology, the reference voltage at the gate of the depletion mode transistor is a ground voltage, and the second supply voltage determined by a magnitude of the negative threshold voltage.

In some embodiments of the described technology, a signal received by the level shifter is widened, by including in the level shifter voltage output, a negative voltage magnitude absent from the signal.

In some embodiments of the described technology, a signal received by the pull-up circuit is widened, by including in the pull-up circuit voltage output, a positive voltage magnitude absent from the signal.

In some embodiments of the described technology the first supply voltage is generated with a voltage pump, such that the voltage pump simultaneously provides the first supply voltage and the second supply voltage.

Another technology described here is an integrated circuit with a level shifter and a voltage regulator described herein, providing a level shifter voltage output having a first maximum voltage determined by a first supply voltage provided to the level shifter. The voltage regulator can be an n-type depletion mode transistor receiving a second supply voltage from a voltage pump and providing the first supply voltage to the level shifter.

Example applications of the disclosed level shifting circuit are a high voltage switch that selects or deselects a memory cell of a NAND memory array, and a word line driver.

DETAILED DESCRIPTION

Figure 1:
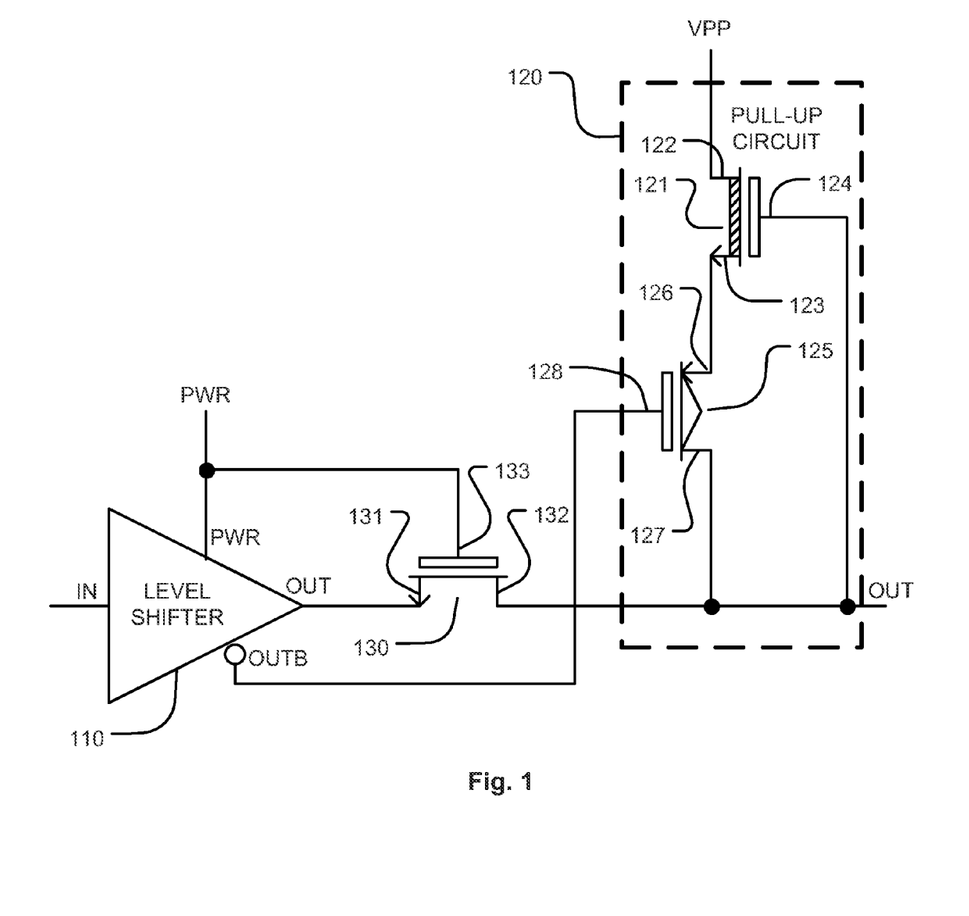
FIG. 1 shows a level shifting circuit with multiple stages receiving power from two supply voltages PWR and VPP.

FIG. 1 shows a level shifting circuit with multiple stages receiving power from two supply voltages PWR and VPP. The supply voltages PWR and VPP can be generated by a low voltage pump and a high voltage pump respectively.

An early stage of the level shifting circuit which is a level shifter 110, is coupled to a later stage of the level shifting circuit which is a pull-up circuit 120.

The level shifter 110 receives power from the PWR supply voltage. The level shifter 110 receives an IN signal, and outputs the OUT signal and its complement OUTB signal. Because of the level shifter 110, there are different maximum voltages of the OUT signal and the IN signal of the level shifter 110. The maximum voltage of the OUT signal from the level shifter 110 is determined by the PWR supply voltage.

The pull-up circuit 120 includes a depletion mode n-type transistor 121 and a p-type transistor 125 that are coupled in series between supply voltage VPP and OUT of the pull-up circuit 120. Because of the pull-up circuit 120, there are different maximum voltages of the OUT signal of the level shifter 110 and the OUT signal of the pull-up circuit 120. The maximum voltage of the voltage range of the OUT signal from the pull-up circuit 120 is determined by the VPP supply voltage. The depletion mode n-type transistor 121 has a drain 122 coupled to the VPP supply voltage, a gate 124 coupled to the OUT of the pull-up circuit 120, and a source 123 coupled to the source 126 of the p-type transistor 125. The p-type transistor 125 has a source 126 coupled to the source 123 of the depletion mode n-type transistor 121, a drain 127 coupled to the OUT of the pull-up circuit 120, and a gate 128 coupled to the complement OUTB signal of the level shifter 110.

The level shifter 110 and the pull-up circuit 120 are coupled together by an n-type transistor 130. The source 131 of the n-type transistor 130 is coupled to OUT of the level shifter 110. The drain 132 of the n-type transistor 130 is coupled to OUT of the pull-up circuit 120. The gate 133 of the n-type transistor 130 is coupled to the PWR supply voltage.

Figure 2:
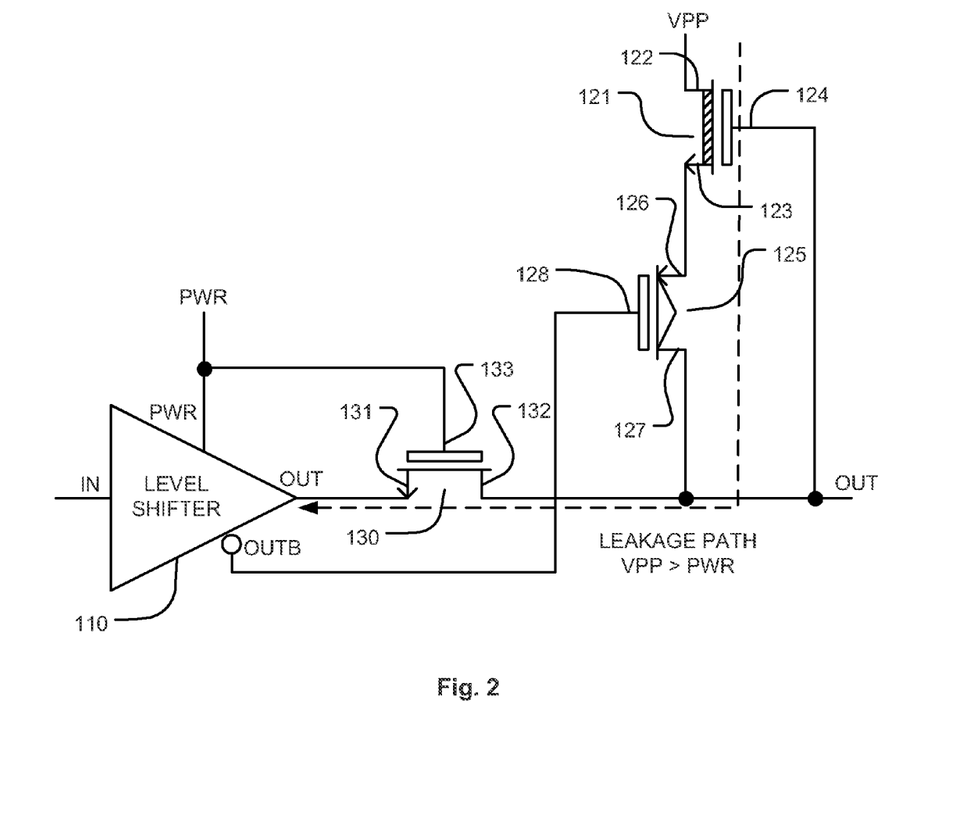
FIG. 2 shows a level shifting circuit with multiple stages receiving power from two supply voltages PWR and VPP, and a leakage path between the two supply voltages.

FIG. 2 shows a level shifting circuit with multiple stages receiving power from two supply voltages PWR and VPP, and a leakage path between the two supply voltages. The supply voltages PWR and VPP can be generated by a low voltage pump and a high voltage pump respectively. Reference numerals in FIG. 1 are generally applicable to FIG. 2. The supply voltages PWR and VPP can be generated by a low voltage pump and a high voltage pump respectively.

In the shown circuit, the VPP supply voltage is greater than the PWR supply voltage. The leakage path flows from VPP, the supply voltage providing power to the pull-up circuit, to PWR, the supply voltage providing power to the level shifter.

Figure 3:
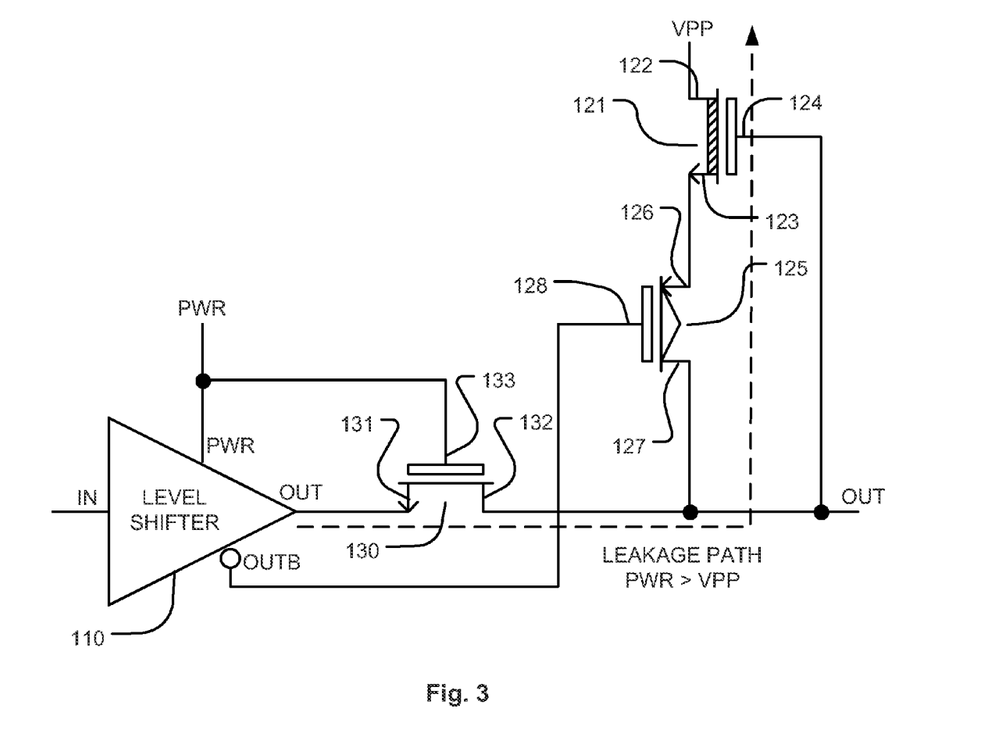
FIG. 3 shows a level shifting circuit with multiple stages receiving power from two supply voltages PWR and VPP, and another leakage path between the two supply voltages.

FIG. 3 shows a level shifting circuit with multiple stages receiving power from two supply voltages PWR and VPP, and another leakage path between the two supply voltages. The supply voltages PWR and VPP can be generated by a low voltage pump and a high voltage pump respectively. Reference numerals in FIG. 1 are generally applicable to FIG. 3.

In the shown circuit, the PWR supply voltage is greater than the VPP supply voltage. The leakage path flows from PWR, the supply voltage providing power to the level shifter, to VPP, the supply voltage providing power to the pull-up circuit.

Figure 4:
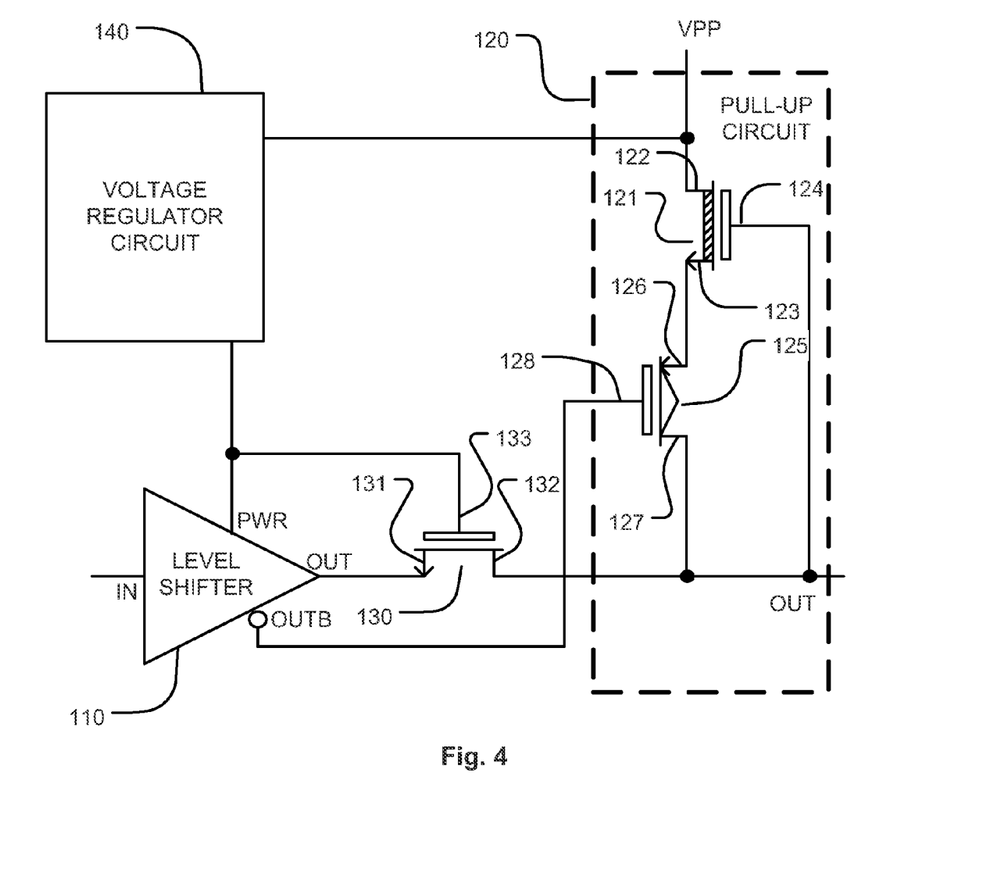
FIG. 4 shows a level shifting circuit with multiple stages receiving power from the same supply voltage VPP, and a voltage regulator circuit that changes the supply voltage VPP to another supply voltage PWR.

FIG. 4 shows a level shifting circuit with multiple stages receiving power from the same supply voltage VPP, and a voltage regulator circuit 140 that changes the supply voltage VPP to another supply voltage PWR. The supply voltage VPP can be generated by a single voltage pump (charge pump). Reference numerals in FIG. 1 are generally applicable to FIG. 4.

The voltage regulator circuit receives the VPP supply voltage and provides the PWR supply voltage to the level shifter. Because the same VPP supply voltage provides power to the level shifter and to the pull-up circuit, timing control is simplified. Because of the single supply voltage, leakage current between different supply voltages is also removed.

The minimum operating voltage of the PWR supply voltage is the difference between the absolute values of the negative threshold voltages of the n-type depletion mode transistor of the pull-up circuit and the p-type transistor of the pull-up circuit, |Vthn|-|Vthp|. This minimum voltage at the PWR (and VPP) supply voltages ensures that the transistors of the pull-up circuit can turn on.

Additional discussion of the level shifter and pull-circuit follows.

In some embodiments, the level shifter and pull-up circuit are in a high voltage switch. The high voltage switch changes the voltage levels from the input logic signals sufficiently to select and deselect blocks of the memory array. The level shifter of the high voltage switch changes the voltage levels to include VNP, the negative voltage reference of the level shifter, or a ground GND. The pull-up circuit changes the voltage levels to include VPP, the positive voltage reference of the pull-up circuit. Accordingly, the high voltage switch changes the voltage levels of the signals from a relatively narrow range of 0 to VDD, to a relatively wide range of VNP and VPP.

Some embodiments generate, at the same time, a high magnitude positive voltage without a high magnitude negative voltage, and/or a high magnitude negative voltage without a high magnitude positive voltage. This feature reduces the area requirement of the transistors.

Generally, a pull-up circuit can be in an x-decoder or row decoder circuit to receive an enable/disable signal and a complement of the enable/disable signal. In response to the enable signal, the pull-up circuit outputs a larger voltage (such as VPP) than the enable signal. In response to the disable signal, the pull-up circuit outputs the disable signal.

In some embodiments, the level shifter and pull-up circuit are in a word line driver.

Figure 5:
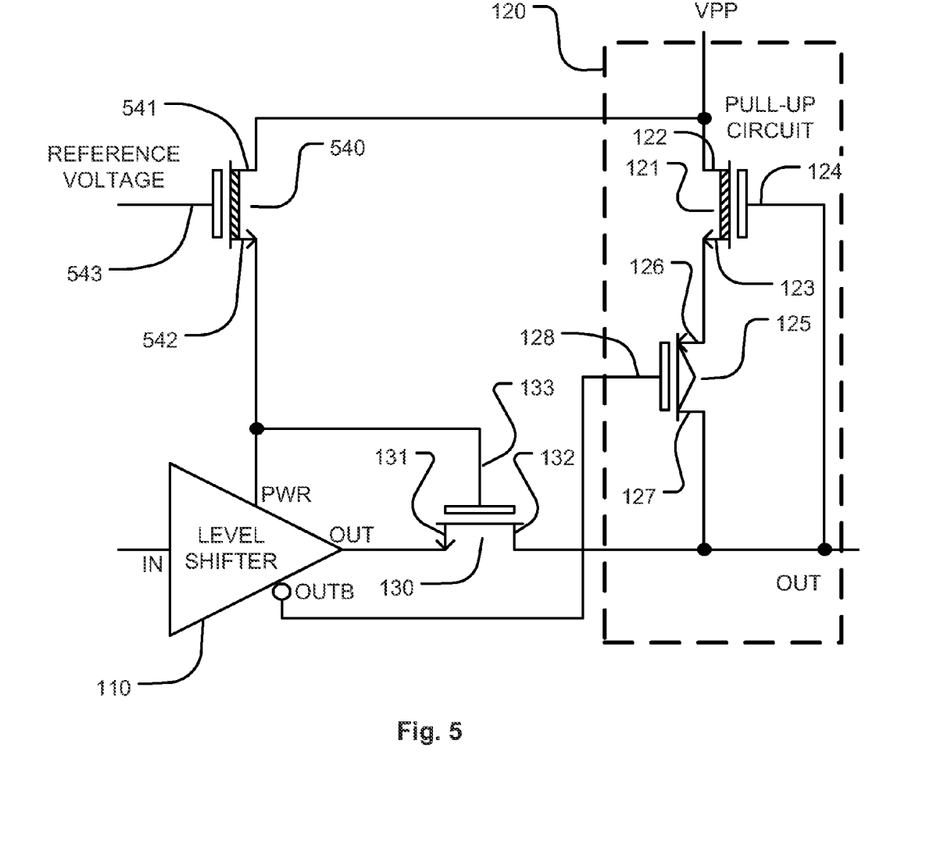
FIG. 5 shows a level shifting circuit with multiple stages receiving power from the same supply voltage VPP, and a voltage regulator circuit that changes the supply voltage VPP to another supply voltage PWR, where the voltage regulator circuit includes a depletion-mode transistor.

FIG. 5 shows a level shifting circuit with multiple stages receiving power from the same supply voltage VPP, and a voltage regulator circuit (e.g. 140 in FIG. 4) that changes the supply voltage VPP to another supply voltage PWR, where the voltage regulator circuit includes a depletion-mode transistor 540. The supply voltage VPP can be generated by a single voltage pump (charge pump). Reference numerals in FIG. 4 are generally applicable to FIG. 5.

The depletion-mode transistor 540 has a negative threshold voltage Vthn with a magnitude of |Vthn|. An example threshold voltage Vthn is around −2V. Other embodiments have higher or lower values. When a reference voltage Vref is applied to the gate 543 of the depletion-mode transistor 540, and the drain voltage of the depletion-mode transistor is at least Vref+|Vthn|, then the source voltage of the depletion-mode transistor is Vref+|Vthn|. The depletion-mode transistor performs voltage regulation by maintaining the source voltage at Vref+|Vthn|, despite the drain voltage increasing to more than Vref+|Vthn|. Accordingly, the supply voltage PWR provided by the source 542 of the depletion-mode transistor 540 is maintained at Vref+|Vthn|, despite the supply voltage VPP increasing to more than Vref+|Vthn|. Drain 541 of the depletion-mode transistor 540 receives power from the supply voltage VPP.

A positive reference voltage Vref applied to the gate of the depletion-mode transistor increases the source voltage of the depletion-mode transistor. In turn, the supply voltage PWR provided to the level shifter increases. Leakage is suppressed by an increased supply voltage PWR.

Figure 6:
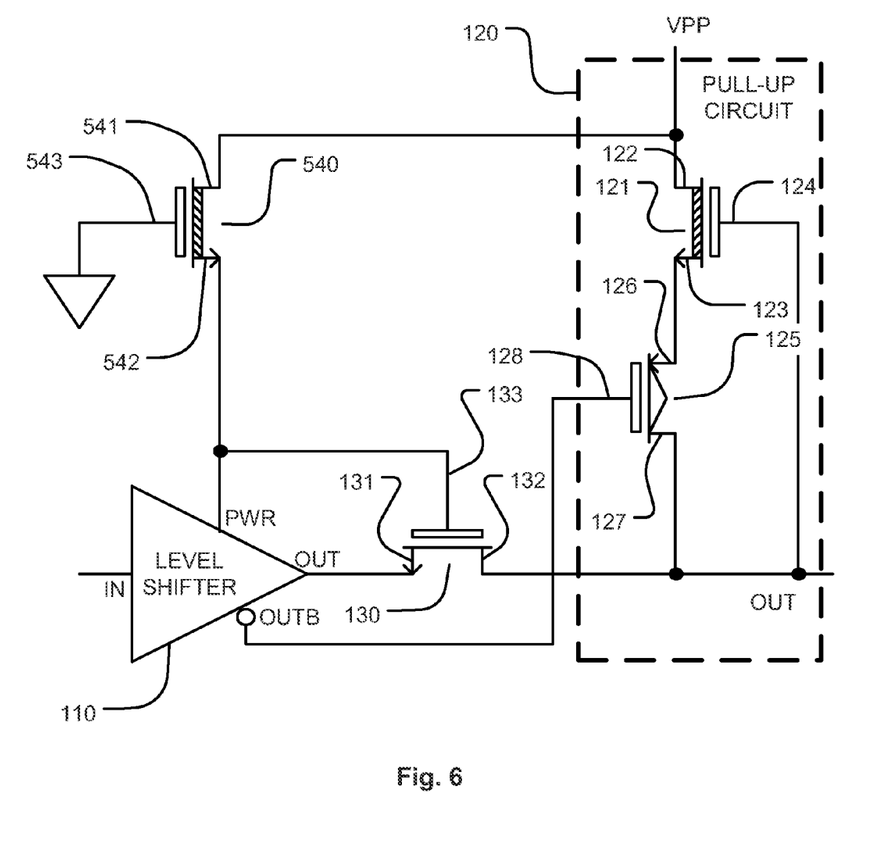
FIG. 6 shows a level shifting circuit with multiple stages receiving power from the same supply voltage VPP, and a voltage regulator circuit that changes the supply voltage VPP to another supply voltage PWR, where the voltage regulator circuit includes a depletion-mode transistor with a gate coupled to ground.

FIG. 6 shows a level shifting circuit with multiple stages receiving power from the same supply voltage VPP, and a voltage regulator circuit that changes the supply voltage VPP to another voltage PWR, where the voltage regulator circuit includes a depletion-mode transistor with a gate coupled to ground. The supply voltage VPP can be generated by a single voltage pump (charge pump). Reference numerals in FIG. 5 are generally applicable to FIG. 6.

The operation is similar to FIG. 5, except that the reference voltage Vref is ground. When a ground voltage is applied to the gate of the depletion-mode transistor, and the drain voltage of the depletion-mode transistor is at least |Vthn|, then the source voltage of the depletion-mode transistor is |Vthn|. The depletion-mode transistor performs voltage regulation by maintaining the source voltage at |Vthn|, despite the drain voltage increasing to more than |Vthn|. Accordingly, the supply voltage PWR provided by the source of the depletion-mode transistor is maintained at |Vthn|, despite the supply voltage VPP increasing to more than |Vthn|.

Figure 7:
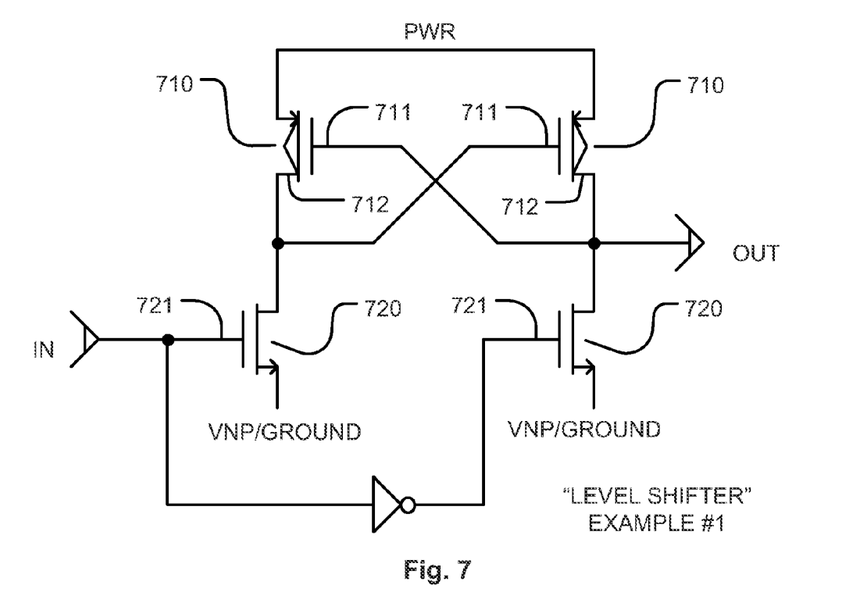
FIGS. 7 and 8 shows examples of the level shifter block, which is an early stage of the level shifting circuit shown in FIGS. 4-6.
Figure 8:
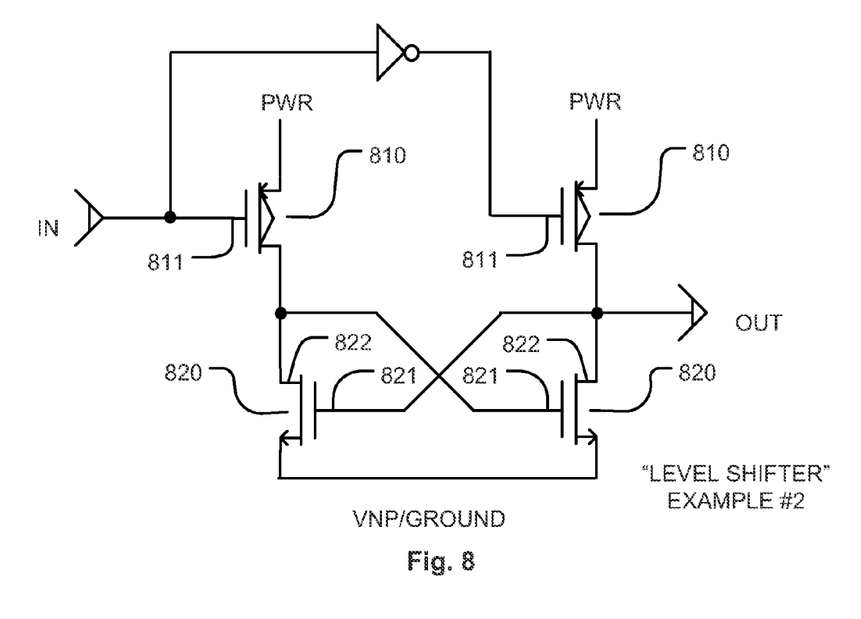

FIGS. 7 and 8 shows examples of the level shifter block, which is an early stage of the level shifting circuit shown in FIGS. 4-6.

The level shifters in FIGS. 7 and 8 resemble cross-coupled inverters, in that there are two pairs of p-type and n-type transistors that are series connected between a high PWR voltage supply and a low voltage reference VNP or ground. If the high value of the IN signal and PWR are different, then the output of the level shifter has a higher maximum voltage changed by the level shifter, to include PWR. The output of the level shifter has a lower minimum voltage changed by the level shifter, to include VNP or ground, depending on the low voltage reference.

In FIG. 7, the gate 711 of each p-type transistor 710 is cross-coupled to the drain 712 of the other p-type transistor 710. Unlike an inverter, the gates 721 of the n-type transistors 720 are respectively coupled to the IN signal, and the complement of the IN signal. The output is an internal node of one of the series connected pair of p-type and n-type transistors. In the shown embodiment, the output is the internal node of one of the series connected pair of p-type and n-type transistors, including the n-type transistor with a gate receiving the complement of the IN signal. This output can be further processed by an inverter to provide OUTB, the complement of the OUT signal.

In FIG. 8, the gate 821 of each n-type transistor 820 is cross-coupled to the drain 822 of the other n-type transistor 820. Unlike an inverter, the gates 811 of the p-type transistors 810 are respectively coupled to the IN signal, and the complement of the IN signal. The output is an internal node of one of the series connected pair of p-type and n-type transistors. In the shown embodiment, the output is the internal node of one of the series connected pair of p-type and n-type transistors, including the p-type transistor with a gate receiving the complement of the IN signal. This output can be further processed by an inverter to provide OUTB, the complement of the OUT signal.

Figure 9:
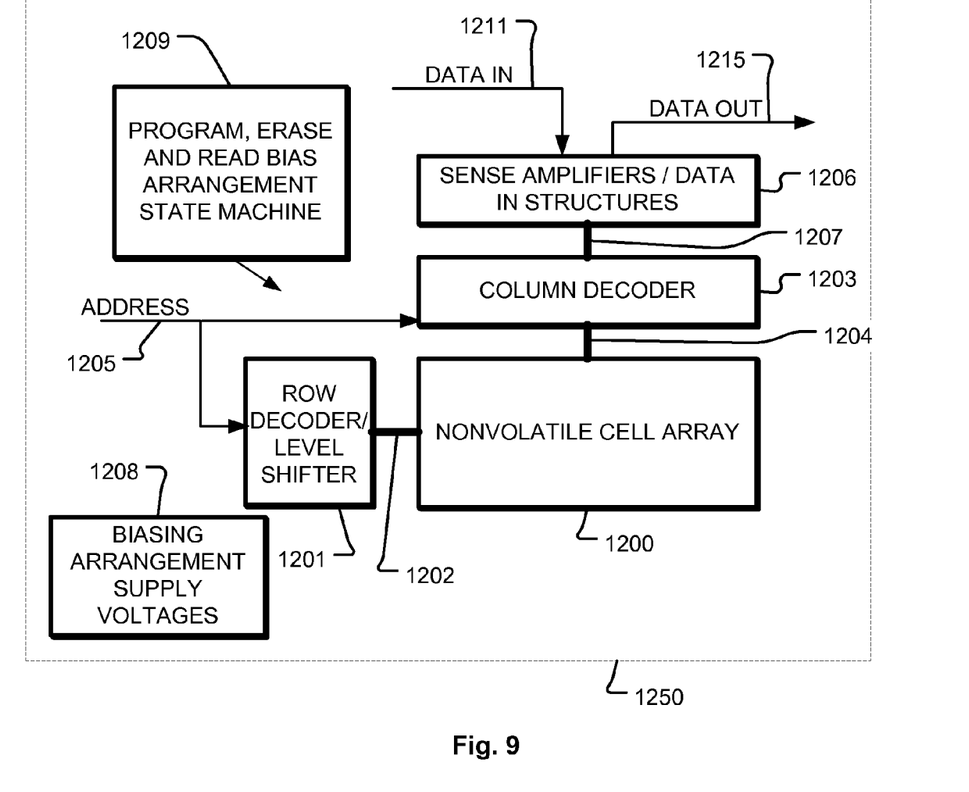
FIG. 9 is a block diagram of the integrated circuit including an array of nonvolatile programmable resistive memory cells, and other circuitry.

FIG. 9 is a block diagram of the integrated circuit including an array of nonvolatile programmable resistive memory cells, and other circuitry.

The integrated circuit 1250 includes a memory array 1200 implemented using NAND memory cells. Addresses are supplied on bus 1205 to column decoder 1203 and row decoder 1201 which includes the improved level shifter circuitry. The improved level shifter circuitry includes a level shifter, a pull-up circuit, and a voltage regulator. The voltage regulator receives a first supply voltage and provides a second supply voltage, so that a single supply voltage provides power to the level shifter and the pull-up circuit. Sense amplifiers and data-in structures in block 1206 are coupled to the column decoder 1203 via data bus 1207. Data is supplied via the data-in line 1211 from input/output ports on the integrated circuit 1250, or from other data sources internal or external to the integrated circuit 1250, to the data-in structures in block 1206. Data is supplied via the data-out line 1215 from the block 1206 to input/output ports on the integrated circuit 1250, or to other data destinations internal or external to the integrated circuit 1250. The integrated circuit 1250 may also include circuitry directed a mission function other than the nonvolatile storage.

A controller implemented in this example using bias arrangement state machine 1209 controls the application of bias arrangement supply voltages 1208, such as read, program, erase, erase verify and program verify voltages, and can employ a single voltage pump (charge pump) to generate the voltages VPP and PWR simultaneously as shown herein. The controller can be implemented using special-purpose logic circuitry as known in the art. In alternative embodiments, the controller comprises a general-purpose processor, which may be implemented on the same integrated circuit, which executes a computer program to control the operations of the device. In yet other embodiments, a combination of special-purpose logic circuitry and a general-purpose processor may be utilized for implementation of the controller.

Figure 10:
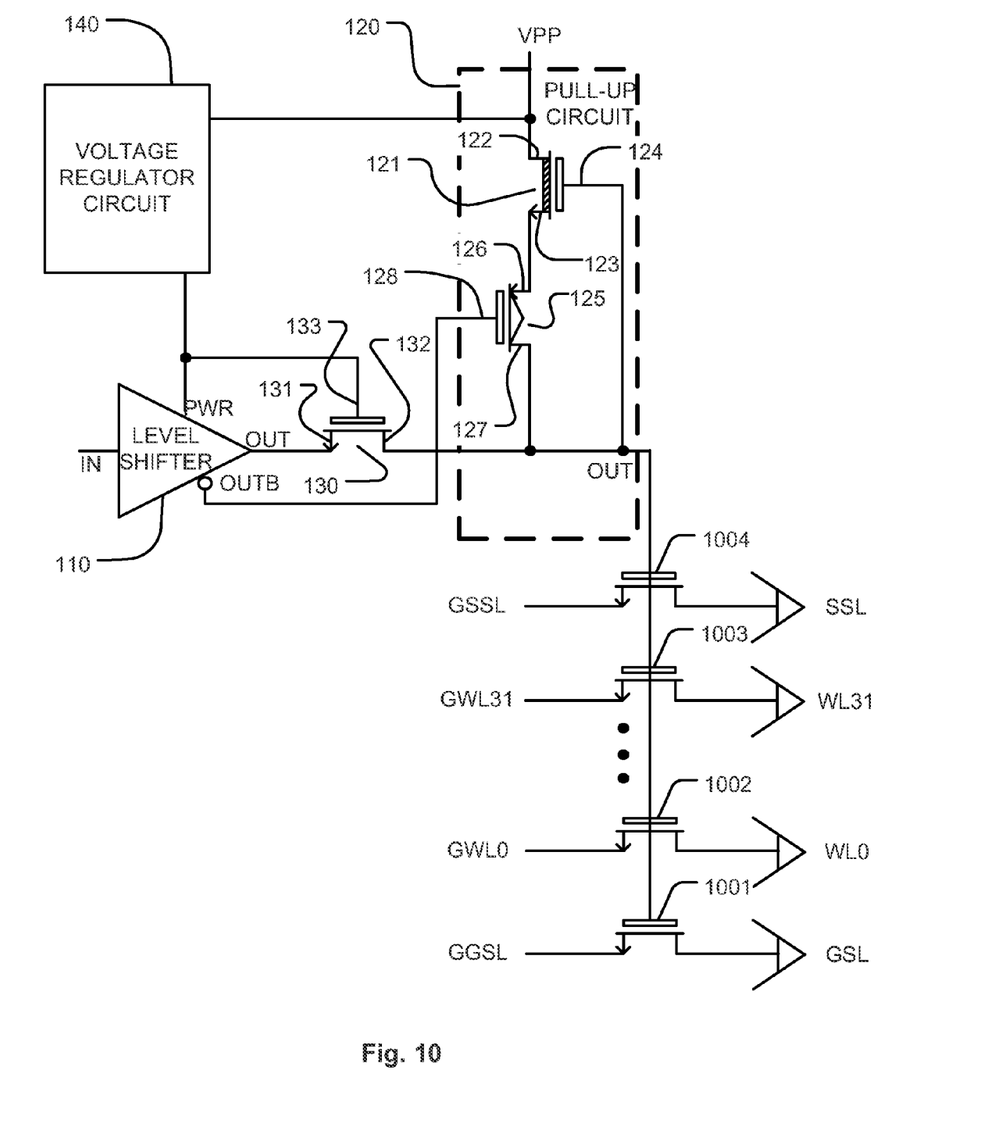
FIGS. 10 and 11 show example applications of the level shifting circuit.
Figure 11:
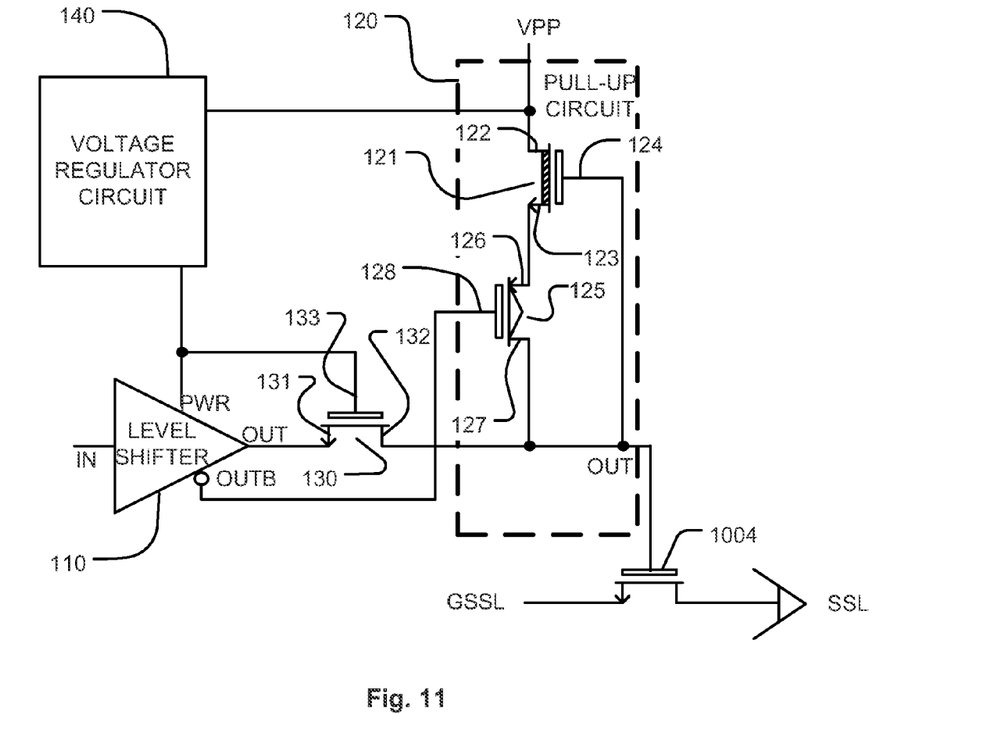

FIGS. 10 and 11 show example applications of the level shifting circuit. Reference numerals in FIG. 4 are generally applicable to FIGS. 10 and 11.

A memory integrated circuit contains many blocks of memory cells. Global word lines GWL[31:0], global string select line GSSL, and global ground select line GGSL are global signals that provide power for word lines WL[31:0], string select line SSL, and ground select line GSL, of every block of the array.

If a particular memory block is selected, then level shifter circuitry outputs VPP, and hence turns on the transistors (e.g. 1001, 1002, 1003, 1004) that are series connected with the NAND strings. In that case, the word line WL0 of the selected block will connect to GWL0, the word line WL1 of the selected block will connect to GWL1, and so on for the remainder of global word lines GWL[31:0] and word lines WL[31:0]. In addition to the word lines WLs, the string select line SSL and ground select GSL of each block work similarly.

If the block is deselected, the level shifter circuitry outputs GND to disconnect the word lines WLs, string select line SSL, and ground select line GSL of the deselected block. The memory blocks share the same level shifting circuitry and the same supply voltage or voltage pump.

In FIG. 10, the level shifting circuit is a block power switch. In FIG. 11, the level shifting circuit is a switch.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. An integrated circuit, comprising:
   a level shifter having an output providing a level shifter voltage output having a first maximum voltage determined by a first supply voltage provided to the level shifter;
   a pull-up circuit coupled to the output of the level shifter, the pull-up circuit having an output providing a pull-up circuit voltage output with a second maximum voltage determined by a second supply voltage provided to the pull-up circuit, the second maximum voltage higher than the first maximum voltage; and
   a voltage regulator circuit having inputs receiving the second supply voltage and a reference voltage and an output providing the first supply voltage to the level shifter, the first supply voltage based on the reference voltage.

2. The integrated circuit of claim 1,
   wherein the voltage regulator circuit includes a depletion mode transistor receiving the second supply voltage and providing the first supply voltage to the level shifter.

3. The integrated circuit of claim 1,
   wherein the voltage regulator circuit includes a depletion mode transistor having a drain coupled to the second supply voltage, a source providing the first supply voltage, and a gate coupled to the reference voltage.

4. The integrated circuit of claim 1,
   wherein the voltage regulator circuit includes a depletion mode transistor having a negative threshold voltage, and the first supply voltage is determined by a sum of the reference voltage and a magnitude of the negative threshold voltage.

5. The integrated circuit of claim 1,
   wherein the voltage regulator circuit includes a depletion mode transistor having a drain coupled to the second supply voltage, a source providing the first supply voltage, and a gate coupled to a ground voltage.

6. The integrated circuit of claim 1,
   wherein the voltage regulator circuit includes a transistor having a threshold voltage with a magnitude determining the first supply voltage.

7. The integrated circuit of claim 1,
   wherein the voltage regulator circuit includes a depletion mode transistor having a negative threshold voltage with a magnitude determining the first supply voltage.

8. The integrated circuit of claim 1,
   wherein the level shifter is a negative level shifter that widens a signal received by the level shifter, by including in the level shifter voltage output, a negative voltage magnitude absent from the signal.

9. The integrated circuit of claim 1,
   wherein the pull-up circuit widens a signal received by the pull-up circuit, by including, in the pull-up circuit voltage output, a positive voltage magnitude absent from the signal.

10. The integrated circuit of claim 1,
    wherein the pull-up circuit includes an n-type depletion mode transistor and a p-type transistor in a series connection between the first supply voltage and the output of the pull-up circuit, the n-type depletion mode transistor having a gate coupled to the output of the pull-up circuit, the p-type transistor having a gate coupled to the level shifter.

11. The integrated circuit of claim 1,
    wherein the level shifter include a first p-type transistor and a first n-type transistor in a first series connection between the first supply voltage and the reference voltage, and a second p-type transistor and a second n-type transistor in a second series connection between the first supply voltage and the reference voltage.

12. The integrated circuit of claim 1, wherein the level shifter, pull-up circuit, and the voltage regulator are in a word line driver circuit.

13. The integrated circuit of claim 1, wherein the level shifter, pull-up circuit, and the voltage regulator are in a power switch that selects and deselects memory blocks.

14. The integrated circuit of claim 1, further comprising:
a voltage pump provides power to the first supply voltage and the second supply voltage simultaneously, the voltage pump providing power to the level shifter and the pull-up circuit.

15. A method of voltage level shifting, comprising:
providing power from a voltage pump generating a first supply voltage to a level shifter having an output and a pull-up circuit coupled to the output of the level shifter, including:
  providing power to the pull-up circuit from the first supply voltage;
  regulating the first supply voltage to provide a second supply voltage based on a reference voltage, the second supply voltage lower than the first supply voltage; and
  providing power to the level shifter from the second supply voltage.

16. The method of claim 15, further comprising:
providing, from the level shifter, a level shifter voltage output with a first maximum voltage determined by the second supply voltage; and
providing, from the pull-up circuit, a pull-up circuit voltage output with a second maximum voltage determined by the first supply voltage, the second maximum voltage higher than the first maximum voltage.

17. The method of claim 15, wherein said regulating includes,
receiving, at a depletion mode transistor, the first supply voltage; and
providing, from the depletion mode transistor, the second supply voltage to the level shifter.

18. The method of claim 15, wherein said regulating includes,
receiving, at a drain of a depletion mode transistor, the first supply voltage; and
providing, from a source of the depletion mode transistor, the second supply voltage to the level shifter.

19. The method of claim 15, wherein said regulating includes,
receiving, at a drain of a depletion mode transistor having a negative threshold voltage, the first supply voltage; and
providing, from a source of the depletion mode transistor, the second supply voltage to the level shifter, the second supply voltage determined by a sum of a magnitude of the negative threshold voltage and the reference voltage at a gate of the depletion mode transistor.

20. The method of claim 15, wherein said regulating includes,
receiving, at a drain of a depletion mode transistor having a negative threshold voltage, the first supply voltage; and
providing, from a source of the depletion mode transistor having a gate coupled to a ground voltage, the second supply voltage to the level shifter, the second supply voltage determined by a magnitude of the negative threshold voltage.

21. The method of claim 15, wherein said regulating includes,
receiving, at a transistor having a threshold voltage, the first supply voltage; and
providing, from the transistor, the second supply voltage determined by a magnitude of the threshold voltage of the transistor.

22. The method of claim 15, wherein said regulating includes,
receiving, at a depletion mode transistor having a negative threshold voltage, the first supply voltage; and
providing, from the depletion mode transistor, the second supply voltage determined by a magnitude of the negative threshold voltage of the depletion mode transistor.

23. The method of claim 15, further comprising:
widening a signal received by the level shifter, by including in a level shifter voltage output, a negative voltage magnitude absent from the signal.

24. The method of claim 15, further comprising:
widening a signal received by the pull-up circuit, by including in a pull-up circuit voltage output, a positive voltage magnitude absent from the signal.

25. The method of claim 15, further comprising:
generating the first supply voltage with the voltage pump, such that the voltage pump provides power to the first supply voltage and the second supply voltage simultaneously.

26. An integrated circuit, comprising:
a level shifter providing a level shifter voltage output having a first maximum voltage determined by a first supply voltage provided to the level shifter; and
an n-type depletion mode transistor receiving a second supply voltage from a voltage pump and providing the first supply voltage to the level shifter.

* * * * *